US012593406B2

(12) United States Patent
Loh et al.

(10) Patent No.: US 12,593,406 B2
(45) Date of Patent: Mar. 31, 2026

(54) PRINTED CIRCUIT BOARD HAVING LEAD PADS THAT ACCOMMODATE OFFSET ELECTRONIC COMPONENT LEADS

(71) Applicant: Sandisk Technologies, Inc., Milpitas, CA (US)

(72) Inventors: Choong Keat Loh, Georgetown (MY); Chii Jian Saw, Bayan Lepas (MY); Chun Yan Koay, Seberang Perai (MY); Soon Chai Tee, Bayan Lepas (MY)

(73) Assignee: Sandisk Technologies, Inc., Milpitas, CA (US)

( * ) Notice: Subject to any disclaimer, the term of this patent is extended or adjusted under 35 U.S.C. 154(b) by 163 days.

(21) Appl. No.: 18/438,059

(22) Filed: Feb. 9, 2024

(65) Prior Publication Data

US 2025/0261310 A1     Aug. 14, 2025

(51) Int. Cl.
 *H05K 1/00*          (2006.01)
 *H05K 1/11*          (2006.01)
 *H05K 1/182*         (2026.01)

(52) U.S. Cl.
 CPC ............. *H05K 1/119* (2013.01); *H05K 1/182* (2013.01); *H05K 2201/09072* (2013.01); *H05K 2201/09381* (2013.01); *H05K 2201/09427*

(2013.01); *H05K 2201/0949* (2013.01); *H05K 2201/10015* (2013.01); *H05K 2201/10757* (2013.01)

(58) Field of Classification Search
 CPC .................. H05K 1/119; H05K 1/182; H05K 2201/09072; H05K 2201/09381; H05K 2201/09427; H05K 2201/0949; H05K 2201/10015; H05K 2201/10757
 See application file for complete search history.

(56) References Cited

U.S. PATENT DOCUMENTS

2025/0194016 A1*   6/2025   Gangadharan ......... H05K 1/181

* cited by examiner

*Primary Examiner* — Pete T Lee

(74) *Attorney, Agent, or Firm* — DENTONS Durham Jones Pinegar

(57)          ABSTRACT

A printed circuit board (PCB) includes lead pads that are shaped and sized to account for offset leads of an electronic component, such as a capacitor. A proximal end of the lead pad has a first dimension and a distal end of the lead pad has a second dimension that is larger than the first dimension. The larger width of the proximal end of the lead pad accommodates offset leads and helps ensure lead joint integrity. The narrower width of the proximal end prevents solder from overflowing onto other areas on the PCB.

20 Claims, 4 Drawing Sheets

PRINTED CIRCUIT BOARD HAVING LEAD PADS THAT ACCOMMODATE OFFSET ELECTRONIC COMPONENT LEADS

BACKGROUND

Capacitors, and other electronic components, are typically included with a number of different electronic devices. Example electronic devices include data storage devices, integrated circuits and the like. Typically, capacitors are surface mounted to a printed circuit board (PCB) of the electronic device and the leads of the capacitor are soldered onto corresponding lead pads on the PCB.

In some examples, a pick and place machine is used to surface mount the capacitor to the PCB. For example, the pick and place machine receives the capacitor, determines where the capacitor is to be placed on the PCB and subsequently places the capacitor at the determined location. The accuracy of the placement of the capacitor is crucial to ensure the capacitor is properly placed on the PCB and to ensure that the leads of the capacitor are aligned with, and properly placed on, the corresponding lead pads.

However, in some instances, the leads of the capacitor are not parallel (or are offset) with respect to one another. For example, one or both of the leads may bend during selection and/or placement by the pick and place machine. In other examples, the leads of the capacitor are offset from one another due to manufacturing tolerances. When the leads are offset, it is challenging for the pick and place machine to place the capacitor on the PCB while ensuring the leads are placed in the center of the lead pads.

Accordingly, it would be beneficial for a PCB to have features that account for offset leads of capacitors and other electronic components.

SUMMARY

The present application describes a substrate or a printed circuit board (PCB) that includes lead pads (also referred to as "trench pads") having a shape and corresponding dimensions that account for offset leads of various electronic components. For example, the lead pads of the PCB are shaped and sized such that a proximal end of each lead pad has a first dimension and a distal end of each lead pad has a second dimension that is larger than the first dimension. The larger width of the proximal end of the lead pad helps ensure that the leads of the electronic component are properly aligned with, and placed on, the lead pads, thereby ensuring lead integrity. The narrower width of the proximal end of the lead pad prevents solder from overflowing onto other areas of the PCB, which could negatively impact the performance of the electronic component.

Accordingly, examples of the present disclosure describe a PCB for a semiconductor package. The PCB includes an opening defined in a planar surface. In an example, the opening is for receiving an electronic component. The PCB also includes a plurality of lead pads proximate to the opening. In an example, each of the plurality of lead pads are for receiving respective leads of the electronic component. Additionally, each of the plurality of lead pads have a first dimension at a proximal end and a second, larger dimension at a distal end.

Other examples describe a semiconductor package that includes a PCB defining an opening. In an example, a first lead pad is proximate the opening and has a proximal end and a distal end. The proximal end has a first dimension and the distal end has a second dimension that is larger than the first dimension. A second lead pad is also proximate the opening. The second lead pad has a proximal end and a distal end. The proximal end also has the first dimension and the distal end has the second dimension.

Still other examples describe a PCB for a semiconductor package. In an example, the PCB includes an electronic component receiving means defined in a planar surface. The PCB also includes a first electronic component lead receiving means proximate the electronic component receiving means. In an example, the first electronic component receiving means has a shape in which a proximal end of the first electronic component receiving means has a first width and a distal end of the first electronic component receiving means has a second width that is larger than the first width. The PCB also includes a second electronic component lead receiving means proximate the electronic component receiving means. In an example, the second electronic component receiving means has a shape in which a proximal end of the second electronic component receiving means has the first width and a distal end of the first electronic component receiving means has the second width.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1A:
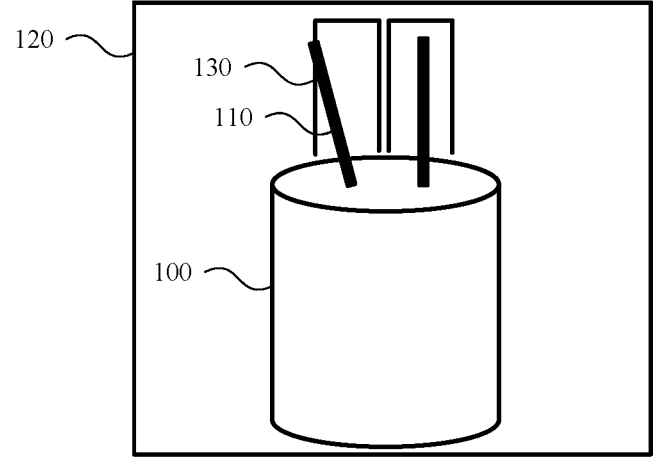
FIG. 1A illustrates an electronic component surface mounted to a printed circuit board (PCB).

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. The following detailed description is therefore not to be taken in a limiting sense, and the scope of the present disclosure is defined by the appended claims and their equivalents.

Electronic devices, such as memory device, integrated circuits and the like, typically include a number of different electronic components. Example electronic components include capacitors, resistors, etc. Typically, these electronic components are surface mounted to a substrate or a printed circuit board (PCB) of the electronic device. For example, a capacitor is typically surface mounted to the substrate or the PCB and the leads of the capacitor are placed on corresponding lead pads on the PCB. When the leads are placed on the lead pads, a soldering process (e.g., a laser soldering process or a wave soldering process) is used to solder the leads to the lead pads.

In some examples, a pick and place machine is used to surface mount the electronic components to the PCB. For example, the pick and place machine receives the electronic component, determines where the electronic component is to be placed on the PCB and places the electronic component at the determined location. As previously discussed, the accuracy of the placement of the electronic component is crucial to ensure that the electronic component is properly placed on the PCB and to ensure that the leads of the electronic component are aligned with, and properly placed on, corresponding lead pads.

However, in some instances, the leads of the capacitor are offset or are otherwise not in parallel with respect to one another. For example, the pick and place machine may inadvertently bend one or both of the leads when the electronic component is initially picked up by the pick and place machine and/or placed by the pick and place machine. In another example, the leads of the electronic component are offset from one another due to manufacturing tolerances.

Regardless of why or how the leads are offset, it is challenging for the pick and place machine to place the electronic capacitor on the substrate or the PCB while maintaining lead joint integrity (e.g., ensuring the lead is property and completely placed in/on a lead pad to achieve a desired signal quality and signal reliability).

To address the above, the present application describes a PCB that has one or more lead pads that account for, or otherwise accommodate, lead offset of various electronic components. For example, the lead pads described herein have a shape and/or dimensions that help ensure that the leads of the electronic component are completely and properly placed on the lead pads during an electronic component surface mounting process-even if the leads of the electronic component are offset.

As will be described in greater detail herein, a proximal end of the lead pad has a first dimension and a distal end of the lead pad has a second dimension that is larger than the first dimension. For example, the proximal end has a first width and the distal end has a second width that is wider or larger than the first width. The larger width toward the distal end caters to the offset angle of the lead while the smaller width of the proximal end prevents solder from overflowing or otherwise spilling off of the lead pads.

In an example, the lead pads have a variety of shapes and/or sizes. For example, the lead pads may be shaped like a trapezoid, a shell, a bottle, or any other shape that has a first width at a first end and extends to a larger width toward or at the second end.

Accordingly, many technical benefits may be realized including, but not limited to, reducing or eliminating lead pad offset issues caused by offset leads and preventing solder overflow, thereby increasing the manufacturing yield of electronic devices.

These and other examples will be explained in greater detail below with respect to FIG. 1A-FIG. 4.

FIG. 1A illustrates an electronic component 100 surface mounted to a PCB 120. In an example, the electronic component 100 is a capacitor having two leads 110. However, as shown, the leads 110 are offset or are otherwise not in parallel with respect to one another.

In an example, the offset leads 110 may be the result of manufacturing tolerances. In another example, the leads 110 may become offset or bent as part of a surface mounting process. For example, a pick and place machine may have inadvertently bent one or more of the leads 110 during pick up and/or placement.

Figure 1B:
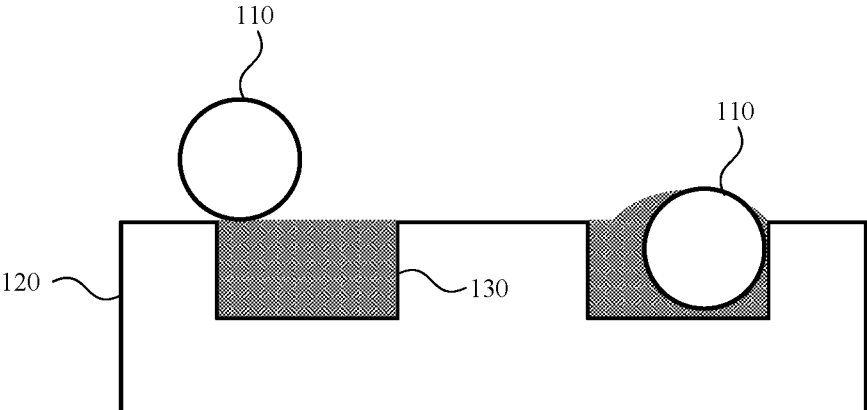
FIG. 1B illustrates how the offset leads of the electronic component of FIG. 1A can cause lead joint integrity issues.

Additionally, in the example shown, the PCB 120 includes two lead pads 130. In an example, the lead pads 130 are etched into the PCB 120 to form trenches such as shown in FIG. 1B. In another example, the lead pads 130 are formed on a top surface of the PCB 120. In current solutions, the lead pads 130 have a uniform shape. For example, the lead pads 130 are rectangular and have the same dimensions from a first side (e.g., a side nearest the electronic component 100) to a second side (e.g., a side that is farthest away from the electronic component 100).

During the surface mounting process, the pick and place machine typically places the electronic component 100 on the PCB 120 such that the leads 110 of the electronic component 100 are centered on, or are otherwise fully received on, the lead pads 130. However, when the leads 110 are offset such as shown in this example, it become difficult to center the leads 110 completely on the lead pads 130. If the leads 110 are not centered on the lead pads 130 or the leads 110 are not entirely placed on the lead pads 130, the lead joint integrity of the electronic component 100 may be compromised.

FIG. 1B illustrates how the offset leads 110 of the electronic component 100 of FIG. 1A can cause lead joint integrity issues. For example, when the leads 110 of the electronic component 100 are offset such as shown in FIG. 1A and subsequently placed on or in the lead pads 130, the leads 110 may not fit within or on the lead pads 130. As a result, no connection is formed between the lead 110 and the lead pad.

Figure 2A:
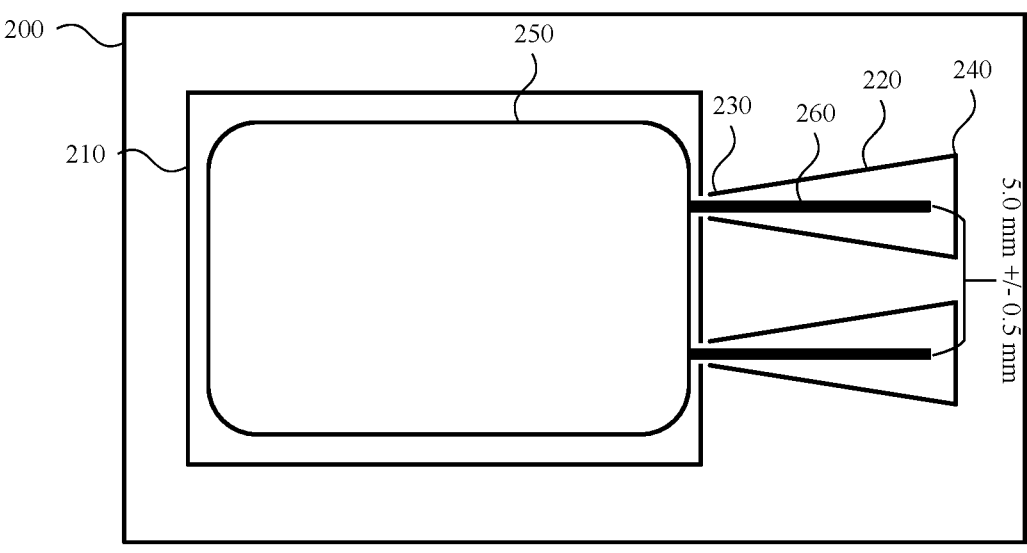
FIG. 2A illustrates a PCB having lead pads that accommodate offset leads of an electronic component according to an example.

FIG. 2A illustrates a printed circuit board (PCB) 200 having lead pads 220 that accommodate offset leads 260 of an electronic component 250 according to an example. In an example, the lead pads 220 are shaped and spaced to accommodate leads that are spaced (or that have lead ends that are spaced) up to 5 millimeters (mm) (or more) apart and accommodate a tolerance of +/-0.5 mm (or more).

Figure 2B:
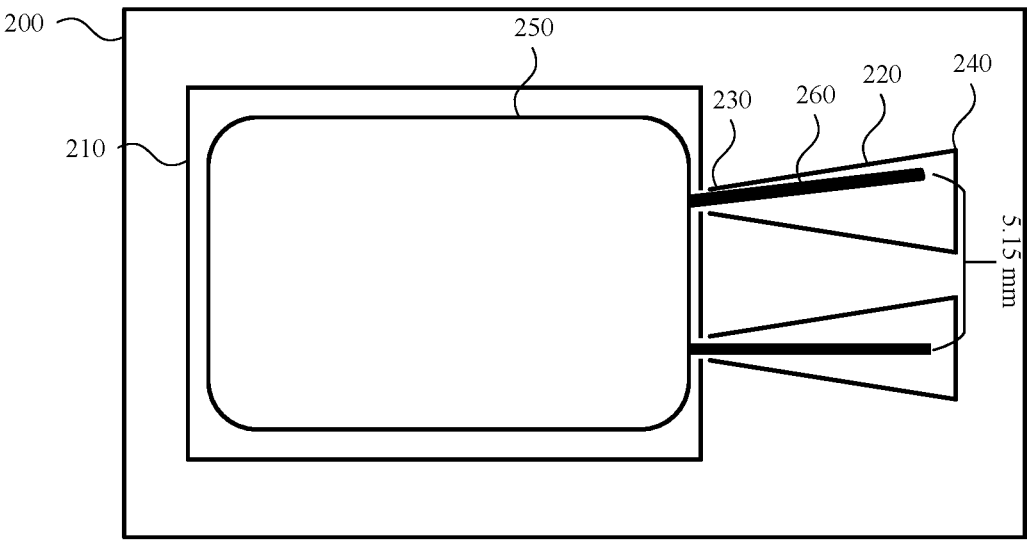
FIG. 2B illustrates how the lead pads of the PCB of FIG. 2A accommodate offset leads of the electronic component according to an example.

In the example shown in FIG. 2A, the leads 260 of the electronic component 250 are not offset (e.g., the leads 220 are parallel). However, the leads 260 of the electronic component 250 shown and described with respect to FIG. 2B are offset with respect to each other. Both examples are shown and described to illustrate how the lead pads 220 of the PCB 200 can accommodate leads that are offset leads that are in parallel.

In an example, the PCB 200 includes a planar surface that defines an opening 210. The opening 210 is adapted to receive the electronic component 250. For example, during an electronic device manufacturing process, a pick and place machine selects the electronic component 250. The pick and place machine also places the electronic component 250 within the opening 210. In an example, the leads 260 of the electronic component 250 are aligned with and/or received on/in the lead pads 220 when the electronic component 250 is placed within the opening 210.

As previously mentioned, the PCB 200 includes one or more lead pads 220. In an example, the lead pads 220 are adjacent, or proximate to, the opening 210. In an example, the lead pads 230 are trench pads. For example, the lead pads 230 are etched into or are otherwise formed in the PCB 200 such that grooves or trenches are formed. In other examples, the lead pads 220 are provided on a top (or bottom) surface of the PCB 200. In some examples, the lead pads 220 include a copper layer or other conductive material.

Unlike the lead pads 130 shown and described with respect to FIG. 1A, the lead pads 230 are shaped and/or have dimensions that accommodate offset leads and leads that are parallel. For example, each lead pad 220 includes a proximal end 230 and a distal end 240. In an example, the proximal end 230 of each lead pad 220 is adjacent to the opening 210. In another example, the proximal end 230 of each lead pad extends into the opening 210. As such, there is a continuous path or channel between the opening 210 and the proximal end 230 of each lead pad 220.

In an example, the lead pads 220 have a trapezoid shape. For example, the proximal end 230 of the lead pad 220 has a first dimension or width and the distal end 240 of the lead pad has a second dimension or width. The lead pad 220 also include two (or more) sidewalls that extend (e.g., in parallel) between the proximal end 230 and the distal end 240. Although a trapezoid shape is specifically mentioned, the lead pads 220 may be configured in any shape.

Figure 3A:
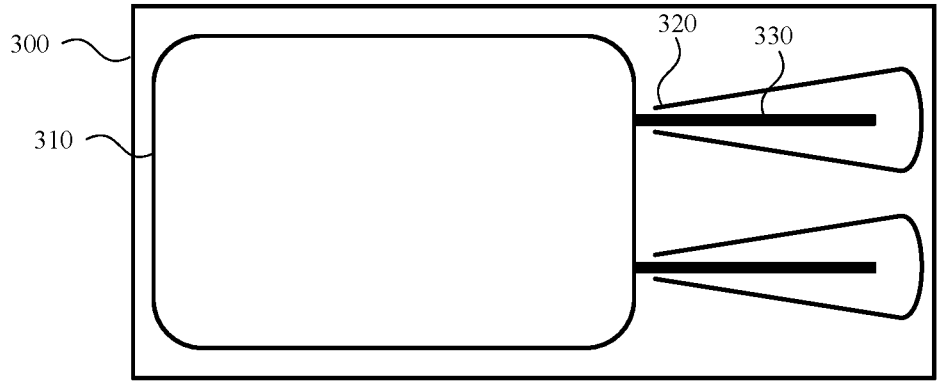
FIG. 3A illustrates a PCB having lead pads for accommodating offset leads of an electronic component according to another example.

In an example, the distal end 240 is flat (such as shown in FIG. 2A). In another example, the distal end 240 is rounded (such as shown in FIG. 3A). However, the distal end 240 may have any shape, pattern (e.g., a zig zag pattern) or configuration.

In an example, the second dimension or width is greater than the first dimension or width. For example, the first width is 0.9 millimeters and the second width is 2 mm (or more). Although specific dimensions are given, the first width may be less than 0.9 mm or greater than 0.9 mm. Likewise, the second width may be less than 2 mm or greater than 2 mm.

However, regarding the width/dimensions of the proximal end 230 of the lead pad 220, the width of the proximal end 230 forms a bottleneck and has a width that enables the leads 260 of the electronic component to be received on/in the lead pads 220 while also preventing solder overflow (e.g., prevent solder from overflowing from the lead pad 220 and into the opening 210 and/or onto the surface of the PCB 200). In some examples, the proximal end 230 of the lead pad 220 has a width between 0.85 mm and 0.95 mm which enables the proximal end 230 to prevent solder overflow.

In an example, the width of the lead pad 220 gradually increases between the proximal end 230 and the distal end 240. For example, and as shown in FIG. 2A, the proximal end 230 has the first width and the distal end 240 has the second width. However, the width of the lead pad 220 gradually increases along the length of the lead pad 220.

FIG. 2B illustrates how the lead pads 220 of the PCB 200 of FIG. 2A accommodate offset leads 260 of an electronic component 250 according to an example. In this example, the electronic component 250 is received or otherwise placed in the opening 210 defined by the PCB 200. Additionally, each lead 260 of the electronic component is received in/on respective lead pads 220. However, as shown, even though at least one of the leads 260 of the electronic component 250 is offset, the shape and/or the dimensions of the lead pad 220 enables the offset lead 260 to be entirely placed on/in the lead pad 220.

For example, the width of the proximal end 230 of the lead pad 230 is sufficiently wide to accommodate a proximal end of the lead 260. Additionally, as the width of the lead pad 230 increases from the proximal end 230 to the distal end 240, a distal end of the lead 260 is still received entirely within the lead pad 220 (which is in contrast to the lead pads

130 shown and described with respect to FIG. 1A). Although FIG. 2B illustrates one lead 260 being bent or offset and the ends of each lead 260 being separated by 5.15 mm (as an example), it is contemplated that both leads 260 may be bent or offset (either away from each other or towards each other). In such examples, the lead pads 220 will still accommodate the offset leads 260 and help ensure lead joint integrity.

FIG. 3A illustrates a PCB 300 having lead pads 320 for accommodating offset leads 330 of an electronic component 310 according to another example. In an example, the PCB 300 is similar to the PCB 200 shown and described with respect to FIG. 2A. For example, the PCB 300 defines an opening that receives the electronic component 310.

Additionally, the lead pads 320 may be similar to the lead pads 220 shown and described with respect to FIG. 2A. However, in this example, the distal end of the lead pad is rounded or has a round shape.

Figure 3B:
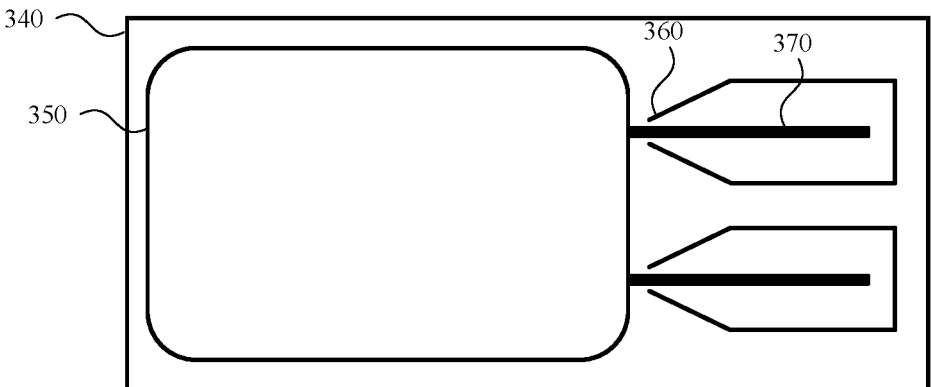
FIG. 3B illustrates a PCB having lead pads for accommodating offset leads of an electronic component according to yet another example.

FIG. 3B illustrates a PCB 340 having lead pads 360 for accommodating offset leads 370 of an electronic component 350 according to yet another example. In an example, the PCB 340 is similar to the PCB 200 shown and described with respect to FIG. 2A. For example, the PCB 340 defines an opening that receives the electronic component 350.

Additionally, the lead pads 360 may be similar to the lead pads 220 shown and described with respect to FIG. 2A. However, in this example, the lead pads 360 are in the shape of a bottle. For example, the proximal end of the lead pad 360 has a first width. The width of the lead pad 360 increases until a second width is reached at or near a middle/center portion of the lead pad 360. The second width is maintained from the middle/center portion to the proximal end of the lead pad 360.

Figure 4:
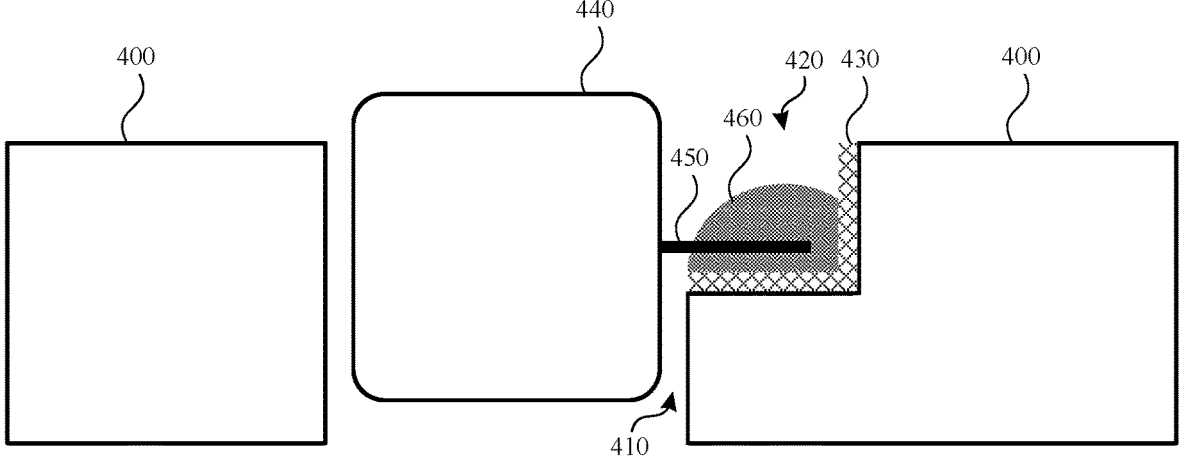
FIG. 4 illustrates a PCB having a lead pad for accommodating an offset lead of an electronic component according to an example.

FIG. 4 illustrates a PCB 400 having a lead pad 420 for accommodating an offset lead 450 of an electronic component 440 according to an example. In an example, the PCB 400 is similar to the PCB 200 shown and described with respect to FIG. 2A.

In an example, the PCB 400 defines an opening 410. A lead pad 420 is adjacent or proximate to the opening 410. In an example, the lead pad 420 includes a copper layer 430 or other conductive material layer.

In an example, a proximal end of the lead pad 420 has a first width or a first dimension and a distal end of the lead pad 420 has a second width or a second dimension that is larger than the first width or dimension. In an example, the first width is a width than enables the lead 450 to be received within the lead pad 430 while also preventing solder 460 from overflowing into the opening 410. For example, if the proximal end of the lead pad 420 is too wide, solder 460 will flow into the opening 410. However, if the proximal end of the lead pad 420 is too narrow, it will prevent the lead 450 from being received on/in the lead pad 420. In an example, the width of the proximal end of the lead pad 420 is 0.9 mm.

Additionally, and as previously described, because the width of the lead pad 420 increases from the proximal end to the distal end, the increased width will also prevent solder 460 from overflowing onto a surface of the PCB 400. This is true even if the leads 450 of the electronic component 440 are offset and/or are near a sidewall of the lead pad. As such, the present disclosure describes a clear improvement when compared with the current implementations shown and described with respect to FIG. 1A.

In accordance with the above, examples of the present disclosure describe a printed circuit board (PCB) for a semiconductor package, comprising: an opening defined in a planar surface of the PCB, the opening for receiving an electronic component; and a plurality of lead pads proximate to the opening, each of the plurality of lead pads for receiving respective leads of the electronic component and having a first dimension at a proximal end and a second, larger dimension at a distal end. In an example, the PCB also includes a copper layer provided in each of the plurality of lead pads. In an example, the plurality of lead pads are shaped and spaced to accommodate the leads of the electronic component when the leads of the electronic component are separated by 5 millimeters (mm)+/−0.5 mm. In an example, the distal end is rounded. In an example, the first dimension is operable to prevent solder from overflowing from each of the plurality of lead pads and into the opening. In an example, the first dimension is between 0.85 millimeters (mm) and 0.95 mm. In an example, a width of each of the plurality of lead pads continuously increases between the first dimension and the second dimension.

Examples also describe a semiconductor package, comprising: a printed circuit board (PCB) defining an opening; a first lead pad proximate the opening and having a proximal end and a distal end, the proximal end having a first dimension and the distal end having a second dimension that is larger than the first dimension; and a second lead pad proximate the opening and having a proximal end and a distal end, the proximal end having the first dimension and the distal end having the second dimension. In an example, the semiconductor package also includes an electronic component provided in the opening, the electronic component including a first lead and a second lead, wherein the first lead is provided in the first lead pad and the second lead is provided in the second lead pad. In an example, a shape of the first lead pad and the second lead pad are operable to receive offset leads of an electronic component when the electronic component is received within the opening. In an example, the offset leads are separated by 5 millimeters (mm)+/−0.5 mm. In an example, the semiconductor package also includes a first copper layer provided in the first lead pad and a second copper layer provided in the second lead pad. In an example, the proximal end of the first lead pad and the proximal end of the second lead pad extend from the opening. In an example, the distal end of the first lead pad is rounded. In an example, the first dimension of the proximal end of the first lead pad controls solder overflow. In an example, the first dimension is between 0.85 millimeters (mm) and 0.95 mm.

Examples also describe a printed circuit board (PCB) for a semiconductor package, comprising: an electronic component receiving means defined in a planar surface of the PCB; a first electronic component lead receiving means proximate the electronic component receiving means, the first electronic component receiving means having a shape in which a proximal end of the first electronic component receiving means has a first width and a distal end of the first electronic component receiving means has a second width that is larger than the first width; and a second electronic component lead receiving means proximate the electronic component receiving means, the second electronic component receiving means having a shape in which a proximal end of the second electronic component receiving means has the first width and a distal end of the first electronic component receiving means has the second width. In an example, the width of the first electronic component lead receiving means gradually increases between the proximal end and the distal end. In an example, the width of the proximal end of the first electronic component lead receiving means is adapted to control solder overflow between the first electronic component lead receiving means and the electronic component receiving means. In an example, a first conductive layer in the first electronic component lead receiving means and a second conductive layer in the second electronic component lead receiving means.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A printed circuit board (PCB) for a semiconductor package, comprising:
   an opening defined in a planar surface of the PCB, the opening for receiving an electronic component; and
   a plurality of lead pads proximate to the opening, each of the plurality of lead pads for receiving respective leads of the electronic component and having a first width at a proximal end and a second, larger width at a distal end.

2. The PCB of claim 1, further comprising a copper layer provided in each of the plurality of lead pads.

3. The PCB of claim 1, wherein the plurality of lead pads are shaped and spaced to accommodate the leads of the electronic component when the leads of the electronic component are separated by 5 millimeters (mm)+/−0.5 mm.

4. The PCB of claim 1, wherein the distal end of at least one of the plurality of lead pads is rounded.

5. The PCB of claim 1, wherein the first width of each of the plurality of lead pads is operable to prevent solder from overflowing from each of the plurality of lead pads and into the opening.

6. The PCB of claim 1, wherein the first dimension is between 0.85 millimeters (mm) and 0.95 mm.

7. The PCB of claim 1, wherein a width of each of the plurality of lead pads continuously increases between the first width and the second width.

8. A semiconductor package, comprising:

a printed circuit board (PCB) defining an opening;

a first lead pad proximate the opening and having a proximal end and a distal end, the proximal end extending from the opening and having a first dimension and the distal end having a second dimension that is larger than the first dimension; and a second lead pad proximate the opening and having a proximal end and a distal end, the proximal end extending from the opening and having the first dimension and the distal end having the second dimension.

9. The semiconductor package of claim 8, further comprising an electronic component provided in the opening, the electronic component including a first lead and a second lead, wherein the first lead is provided in the first lead pad and the second lead is provided in the second lead pad.

10. The semiconductor package of claim 8, wherein a shape of the first lead pad and the second lead pad is operable to receive offset leads of an electronic component when the electronic component is received within the opening.

11. The semiconductor package of claim 10, wherein the offset leads are separated by 5 millimeters (mm)+/−0.5 mm.

12. The semiconductor package of claim 8, further comprising a first copper layer provided in the first lead pad and a second copper layer provided in the second lead pad.

13. The semiconductor package of claim 8, wherein distal end of the first lead pad is rounded.

14. The semiconductor package of claim 8, wherein the first dimension of the proximal end of the first lead pad controls solder overflow.

15. The semiconductor package of claim 8, wherein the first dimension is between 0.85 millimeters (mm) and 0.95 mm.

16. A printed circuit board (PCB) for a semiconductor package, comprising:

an electronic component receiving means defined in a planar surface of the PCB;

a first electronic component lead receiving means proximate the electronic component receiving means, the first electronic component lead receiving means having a shape in which a proximal end of the first electronic component lead receiving means has a first width and a distal end of the first electronic component lead receiving means has a second width that is larger than the first width; and a second electronic component lead receiving means proximate the electronic component receiving means, the second electronic component lead receiving means having a shape in which a proximal end of the second electronic component lead receiving means has the first width and a distal end of the second electronic component lead receiving means has the second width.

17. The PCB of claim 16, wherein the width of the first electronic component lead receiving means gradually increases between the proximal end and the distal end.

18. The PCB of claim 16, wherein the width of the proximal end of the first electronic component lead receiving means is adapted to control solder overflow between the first electronic component lead receiving means and the electronic component receiving means.

19. The PCB of claim 16, further comprising a first conductive layer in the first electronic component lead receiving means and a second conductive layer in the second electronic component lead receiving means.

20. The PCB of claim 16, wherein the distal end of the first electronic component lead receiving means is rounded.

* * * * *